(12) United States Patent
Yun

(10) Patent No.: US 12,526,966 B2
(45) Date of Patent: Jan. 13, 2026

(54) ELECTRONIC CONTROL UNIT AND VEHICLE HAVING THE SAME

(71) Applicant: LG ELECTRONICS INC., Seoul (KR)

(72) Inventor: Donghwa Yun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 233 days.

(21) Appl. No.: 18/376,642

(22) Filed: Oct. 4, 2023

(65) Prior Publication Data
US 2025/0089221 A1    Mar. 13, 2025

(30) Foreign Application Priority Data

Sep. 12, 2023   (KR) .................. 10-2023-0120855

(51) Int. Cl.
*H05K 7/20*   (2006.01)
(52) U.S. Cl.
CPC ..... *H05K 7/20872* (2013.01); *H05K 7/20254* (2013.01)
(58) Field of Classification Search
CPC ........... H05K 7/20254; H05K 7/20272; H05K 7/20872; H01L 23/473
See application file for complete search history.

(56) References Cited

U.S. PATENT DOCUMENTS

| | | | |
|---|---|---|---|
| 5,323,292 A | 6/1994 | Brzezinski | |
| 7,295,433 B2 * | 11/2007 | Taylor | H05K 7/20872 361/689 |
| 9,148,946 B1 * | 9/2015 | Singh | H05K 7/2089 |
| 9,307,680 B2 | 4/2016 | Schmit | |
| 10,314,207 B1 | 6/2019 | Skalski et al. | |
| 10,665,525 B2 | 5/2020 | Teysseyre et al. | |
| 10,720,852 B1 * | 7/2020 | Soles | H05K 7/20872 |
| 2011/0013365 A1 * | 1/2011 | Oota | H02K 11/33 361/707 |
| 2019/0223319 A1 * | 7/2019 | Engelhardt | H05K 7/20336 |
| 2020/0386144 A1 | 12/2020 | Jeong et al. | |
| 2021/0280498 A1 | 9/2021 | Kang et al. | |

(Continued)

FOREIGN PATENT DOCUMENTS

KR   10-2020-0141184 A   12/2020
WO   WO 2021/042781 A1   3/2021

*Primary Examiner* — Zachary Pape
(74) *Attorney, Agent, or Firm* — Birch, Stewart, Kolasch & Birch, LLP

(57) ABSTRACT

The electronic control unit according to this embodiment comprises a first control unit, and the first control unit comprises a bottom coolant jacket in which a first passage and a second passage spaced apart from the first passage are formed; and a top coolant jacket in which a third passage communicate with the second passage and a fourth passage spaced apart from the third passage are formed. A lower coolant passage through which coolant passes may be formed between the first passage and the second passage and a plurality of lower cooling fins may be formed in a lower coolant passage. An upper coolant passage through which coolant passes may be formed between the third passage and the fourth passage and a plurality of upper cooling fins may be formed in the upper coolant passage. A first control board may be disposed between the bottom coolant jacket and the top coolant jacket.

18 Claims, 10 Drawing Sheets

(56) References Cited

U.S. PATENT DOCUMENTS

| | | | |
|---|---|---|---|
| 2023/0189487 A1* | 6/2023 | Kwon | H01L 23/4735 361/699 |
| 2023/0240056 A1 | 7/2023 | David et al. | |
| 2024/0215211 A1* | 6/2024 | Matsuoka | H02M 7/5387 |

* cited by examiner

ELECTRONIC CONTROL UNIT AND VEHICLE HAVING THE SAME

CROSS-REFERENCE TO RELATED APPLICATIONS

Pursuant to 35 U.S.C. § 119(a), this application claims the benefit of earlier filing date and right of priority to Korean Patent Application No(s). 10-2023-0120855, filed on Sep. 12, 2023, the contents of which are all hereby incorporated by reference herein in their entirety.

BACKGROUND

The present invention relates to an electronic control unit and vehicle having the same Assemblies installed in a vehicle comprise an engine control assembly (or motor control assembly), power transmission assembly, brake assembly, suspension assembly, steering assembly, instrument assembly, and information and communication control assembly.

An electronic control unit (ECU) is a control device that has the function of controlling and managing the main assemblies of a vehicle. A number of electronic control units are installed in the vehicle depending on the assembly to control each assembly.

The electronic control unit may comprise an electronic control unit with a built-in chip for autonomous driving or infotainment (software or media that adds entertainment to the transfer of information) installed in the vehicle, and it is desirable for the chip or the board (control board) on which the chip is installed to be properly cooled to prevent overheating of the chip.

An example of an electronic control unit being cooled is an electronic module disclosed in U.S. Pat. No. 5,323,292 A (patent, on Jun. 21, 1994). The electronic module comprises an aluminum heat sink surrounding an integrated circuit chip and a substrate, and the aluminum heat sink comprises parallel fins that provide a larger surface area to dissipate heat into the surrounding atmosphere.

SUMMARY

The present embodiment to provide an electronic control unit in which both sides of a control board can be cooled and a vehicle having the same.

The electronic control unit according to this embodiment comprises a first control unit, and the first control unit comprises a bottom coolant jacket in which a first passage and a second passage spaced apart from the first passage are formed; and a top coolant jacket in which a third passage communicate with the second passage and a fourth passage spaced apart from the third passage are formed. A lower coolant passage through which coolant passes may be formed between the first passage and the second passage and a plurality of lower cooling fins may be formed in a lower coolant passage. An upper coolant passage through which coolant passes may be formed between the third passage and the fourth passage and a plurality of upper cooling fins may be formed in the upper coolant passage. A first control board may be disposed between the bottom coolant jacket and the top coolant jacket.

The bottom coolant jacket may comprise a bottom jacket formed with the first passage, the second passage, the lower coolant passage, and the plurality of lower cooling fins; and an inner bottom cover disposed on an upper surface of the bottom jacket and covering the lower coolant passage and the plurality of lower cooling fins.

The top coolant jacket may comprise a top jacket formed with the third passage, the fourth passage, the upper coolant passage, and the plurality of upper cooling fins, and an inner top cover disposed on a lower surface of the top jacket and covering the upper coolant passage and the plurality of upper cooling fins.

The first control unit may further comprise an inner gasket sealing between the second passage and the third passage.

The electronic control unit may further comprise a second control unit disposed below a lower surface of the bottom coolant jacket.

The second control unit may comprise a first lower case disposed below the lower surface of the bottom coolant jacket; a second lower case disposed below the first lower case; and a second control board accommodated between the first lower case and the second lower case.

The electronic control unit may further comprise a lower thermal pad disposed between the lower surface of the bottom coolant jacket and an upper surface of the first lower case.

The electronic control unit may further comprise a third control unit disposed above an upper surface of the top coolant jacket.

The third control unit may comprise a first upper case disposed above the upper surface of the top coolant jacket; a second upper case disposed above the first upper case; and a first upper control board accommodated between the first upper case and the second upper case.

The electronic control unit may further comprise an upper thermal pad disposed between the upper surface of the top coolant jacket and a lower surface of the first upper case.

The electronic control unit may further comprise a fourth control unit disposed above the upper surface of the top coolant jacket.

The fourth control unit may comprise a third upper case disposed above the upper surface of the top coolant jacket; a fourth upper case disposed above the third upper case; and a second upper control board accommodated between the third upper case and the fourth upper case.

The electronic control unit may further comprise an upper thermal pad disposed between the upper surface of the top coolant jacket and a lower surface of the third upper case.

The fourth control unit may be disposed in line with the third control unit in the longitudinal direction of the first control unit.

The third control unit may be closer to the fourth passage of the third passage and the fourth passage, and the fourth control unit may be closer to the third passage of the third passage and the fourth passage.

A vehicle according to this embodiment comprises an electronic control unit comprising a first control unit; and a water-cooled cooling device flowing coolant to the first control unit.

The electronic control unit according to this embodiment comprises a first control unit, and the first control unit comprises a bottom coolant jacket in which a first passage and a second passage spaced apart from the first passage are formed; a top coolant jacket in which a third passage communicate with the second passage and a fourth passage spaced apart from the third passage are formed, a first nipple disposed in the first passage; and a second nipple disposed in the fourth passage. A lower coolant passage through which coolant passes may be formed between the first passage and the second passage and a plurality of lower cooling fins may be formed in a lower coolant passage. An upper coolant passage through which coolant passes may be formed between the third passage and the fourth passage and a plurality of upper cooling fins may be formed in the upper coolant passage. A first control board may be disposed between the bottom coolant jacket and the top coolant jacket.

The water-cooled cooling device may comprise a coolant valve suppling coolant to the first nipple or to the second nipple.

The vehicle may further comprise a second control unit disposed below a lower surface of the bottom coolant jacket and the coolant valve supplies coolant to the first nipple.

The vehicle may further comprise a second control unit disposed below a lower surface of the bottom coolant jacket; and a third control unit disposed above an upper surface of the top coolant jacket, the coolant valve supplies coolant to the second nipple.

The vehicle may further comprise a fourth control unit disposed above the upper surface of the top coolant jacket.

The third control unit may be closer to the fourth passage of the third passage and the fourth passage, and the fourth control unit may be closer to the third passage of the third passage and the fourth passage.

DETAILED DESCRIPTION OF THE EMBODIMENTS

Hereinafter, detailed embodiments will be described in detail with reference to the accompanying drawings.

Figure 1:
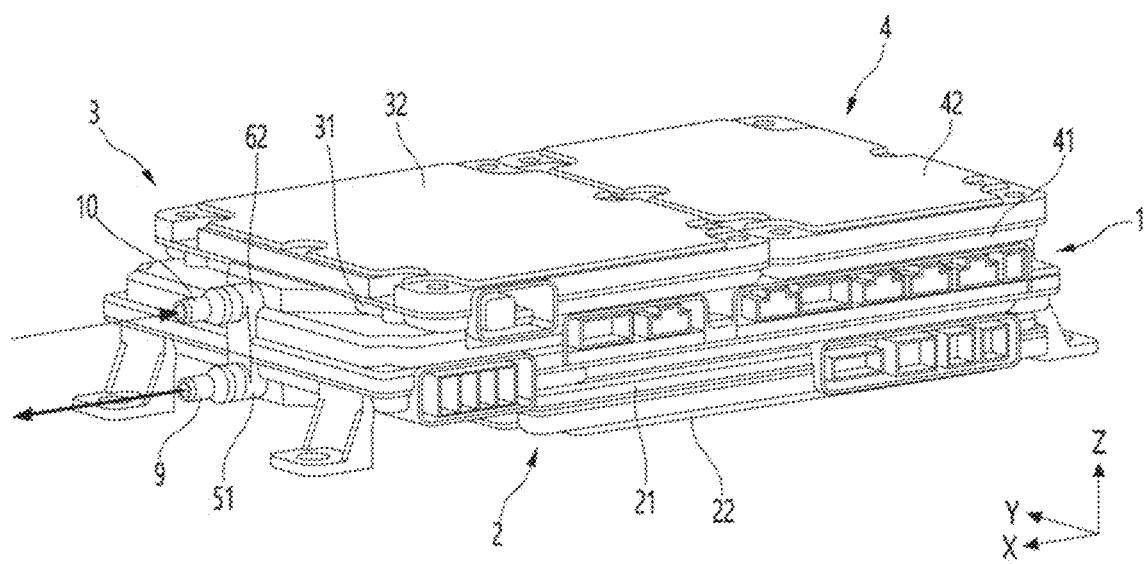
FIG. 1 is a perspective view of an example of an electronic control unit according to this embodiment.
Figure 2:
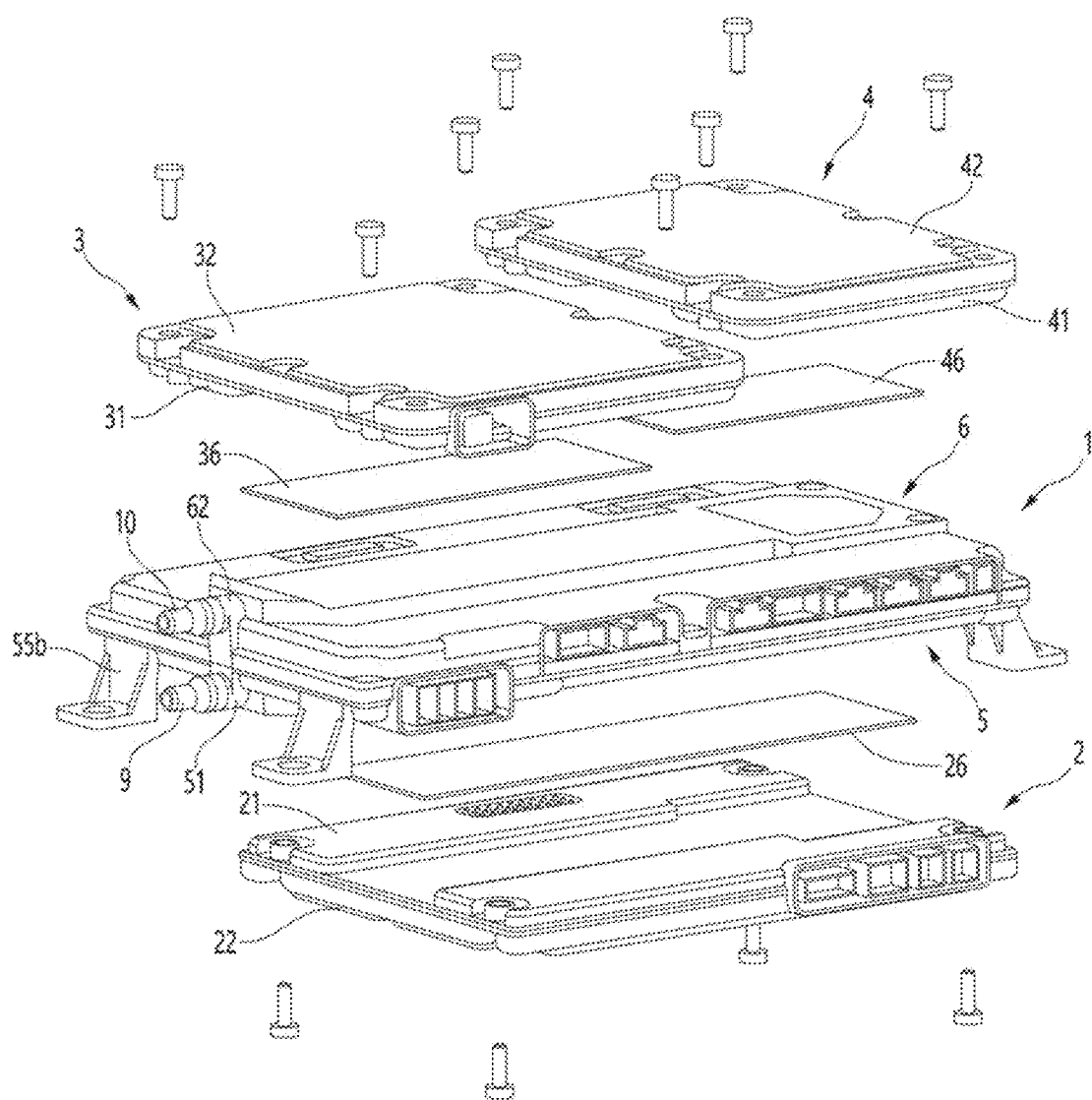
FIG. 2 is an exploded perspective view of an example of an electronic control unit according to this embodiment.
Figure 3:
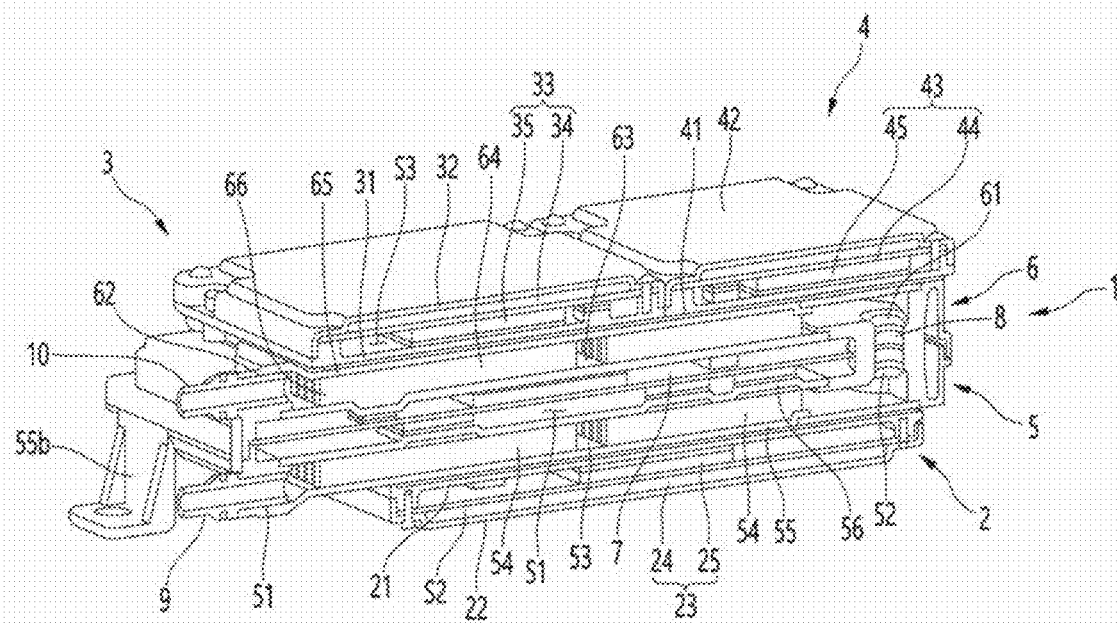
FIG. 3 is a partial cutaway perspective view of an example of an electronic control unit according to this embodiment.
Figure 4:
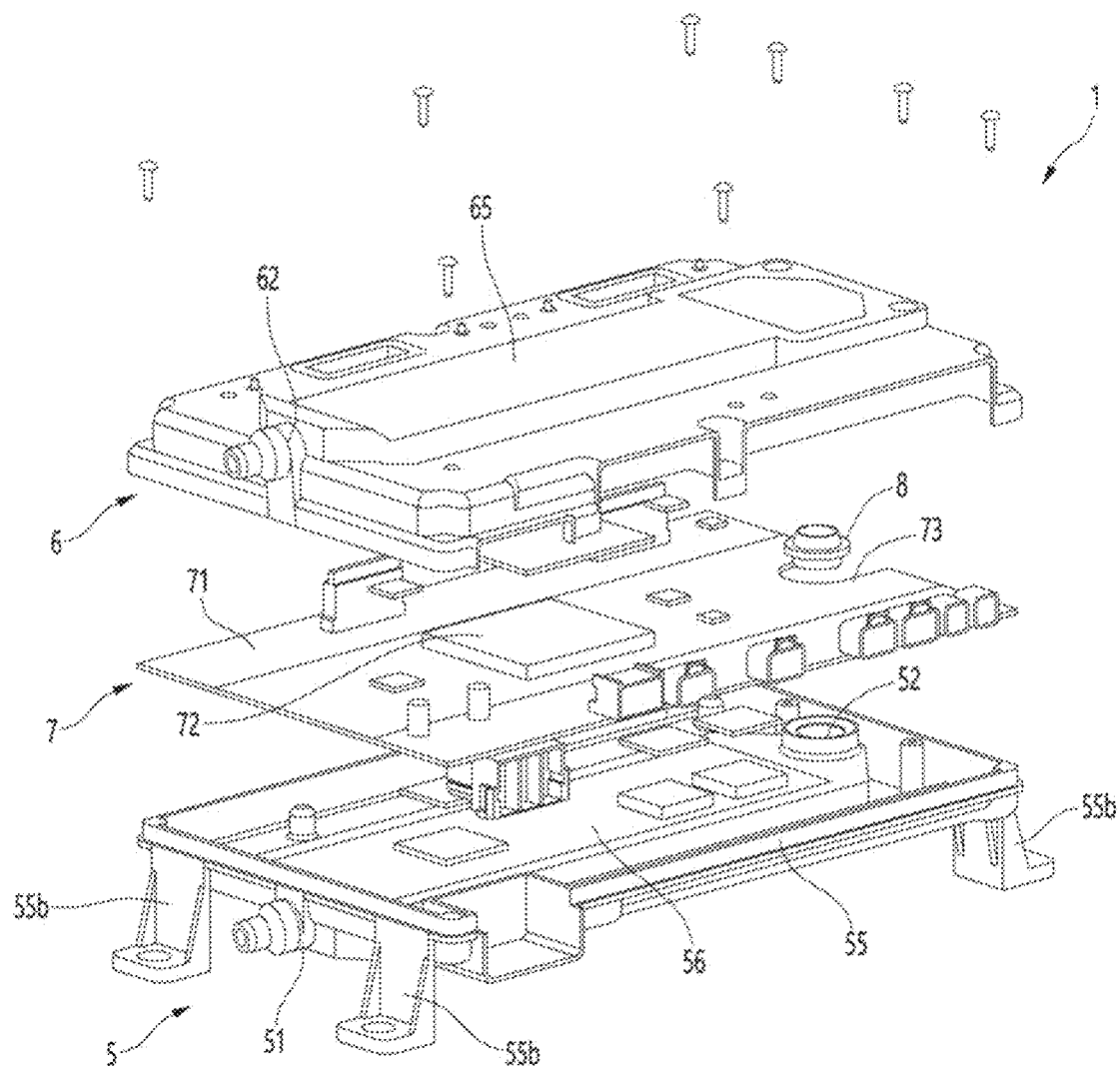
FIG. 4 is an exploded perspective view of an example of a first control unit according to this embodiment.
Figure 5:
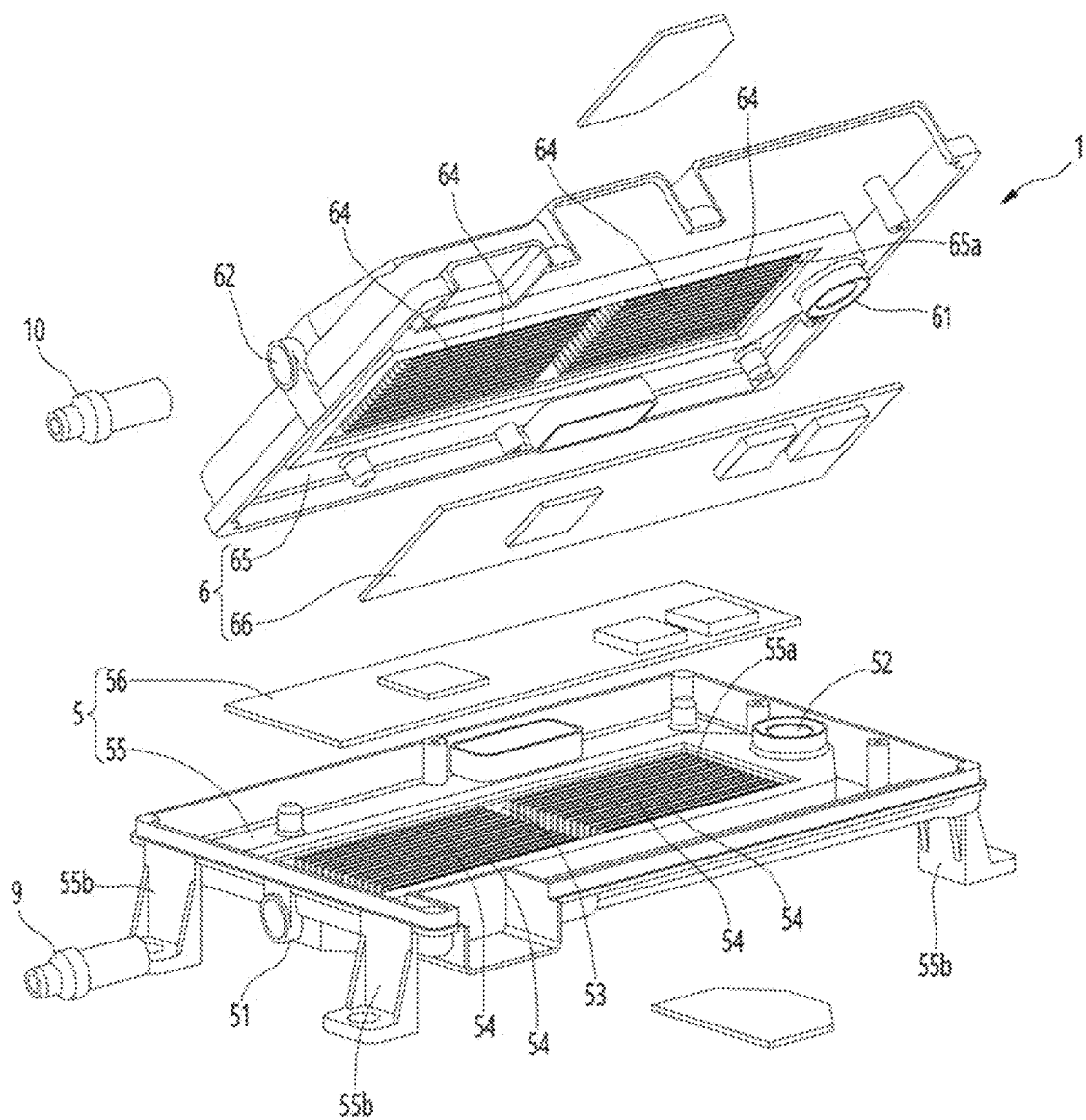
FIG. 5 is an exploded perspective view of the bottom coolant jacket and top coolant jacket shown in FIG. 4.

FIG. 1 is a perspective view of an example of an electronic control unit according to this embodiment; FIG. 2 is an exploded perspective view of an example of an electronic control unit according to this embodiment; FIG. 3 is a partial cutaway perspective view of an example of an electronic control unit according to this embodiment; FIG. 4 is an exploded perspective view of an example of a first control unit according to this embodiment; and FIG. 5 is an exploded perspective view of the bottom coolant jacket and top coolant jacket shown in FIG. 4;

The electronic control unit may be installed in a vehicle and may be a control unit for autonomous driving of the vehicle.

The electronic control unit may be connected to a water-cooled cooling device installed in the vehicle and may be cooled by coolant circulated by the water-cooled cooling device.

The electronic control unit may comprise at least one control unit. It is possible for the at least one control unit to comprise only one first control unit 1, and it is also possible to further comprise at least one extended control unit in addition to the first control unit 1.

When the electronic control unit further comprises an extended control unit, the extended control unit may comprise only the second control unit 2 mounted on the first control unit 1, or the extended control unit may comprise the second control unit 2 and the third control unit 3 mounted on the first control unit 1, or the extended control unit may comprise a second control unit 2, a third control unit 3, and a fourth control unit 4 mounted on the first control unit 1.

The first control unit 1 may be an autonomous driving control unit for executing level 1 or level 2 of the autonomous driving levels.

The second control unit 2 may be an autonomous driving control unit for executing level 2+ of the autonomous driving levels, or an infotainment control unit capable of executing the vehicle's infotainment (software or media that adds entertainment to the delivery of information).

The second control unit 2 may be a control unit disposed below the lower surface of the first control unit 1.

The third control unit 3 may be an autonomous driving control unit for executing level 3 of the autonomous driving levels.

The third control unit 3 may be a control unit disposed above the upper surface of the first control unit 1.

The fourth control unit 4 may be an autonomous driving control unit for executing level 4 of the autonomous driving levels.

The fourth control unit 4 may be a control unit disposed above the upper surface of the first control unit 1 together with the third control unit 3.

Each of the first control unit 1, the second control unit 2, the third control unit 3, and the fourth control unit 4 may comprise a control board.

The control board may have semiconductor chips such as MCUs for autonomous driving or infotainment installed on the board.

A coolant passage capable of cooling the control board disposed in the first control unit 1 may be formed in the first control unit 1, and a coolant passage may not be formed in each of the second control unit 2, the third control unit 3, and the fourth control unit 4, and control boards of the second control unit 2, third control unit 3, and fourth control unit 4 can be cooled by coolant passing through a coolant passage formed in the first control unit 1.

Hereinafter, each control unit will be described.

The first control unit 1 may have a length in the front and rear direction X, a width in the left and right direction Y, and a thickness in the up and down direction Z.

The first control unit 1 may comprise a bottom coolant jacket 5, a top coolant jacket 6, and a first control board 7.

The bottom coolant jacket 5 may be formed with a first passage 51 and a second passage 52 spaced apart from the first passage 52.

The bottom coolant jacket 5 may be formed with a lower coolant passage 53 and a plurality of lower cooling fins 54 through which coolant passes between the first passage 51 and the second passage 52.

The first passage 51 may be formed at one end of the bottom coolant jacket 5 in the longitudinal direction X. The first passage 51 may be open in the longitudinal direction X of the bottom coolant jacket 5.

The second passage 52 may be formed close to the other end of the bottom coolant jacket 5 in the longitudinal direction X. The second passage 52 may be open in the thickness direction Z of the bottom coolant jacket 5.

The lower coolant passage 53 may be formed to be long in the longitudinal direction X of the bottom coolant jacket 5.

The plurality of lower cooling fins 54 may be located in the lower coolant passage 53 and may be formed to be long in the longitudinal direction X of the bottom coolant jacket 5. The length of the plurality of lower cooling fins 54 may be shorter than the length of the lower coolant passage 53.

The plurality of lower cooling fins 54 may be disposed in the lower coolant passage 53. The plurality of lower cooling fins 54 may be spaced apart from each other in the width direction Y of the bottom coolant jacket 5. A unit passage through which coolant is distributed may be formed between a pair of adjacent lower cooling fins 54.

The bottom coolant jacket 5 may be composed of a combination of multiple members. The bottom coolant jacket 5 may comprise a bottom jacket 55 and an inner bottom cover 56.

The first passage 51, the second passage 52, the lower coolant passage 53, and the plurality of lower cooling fins 54 may be formed in the bottom jacket 55.

The bottom jacket 55 may have a lower opening 55a formed above the upper side of the lower coolant passage 53 to expose the lower coolant passage 53 and the plurality of lower cooling fins 54.

The inner bottom cover 56 may be disposed on the upper surface of the bottom jacket 55. The inner bottom cover 56 may be disposed in the lower opening 55a. The inner bottom cover 56 may cover the lower coolant passage 53 and the plurality of lower cooling fins 54.

The bottom coolant jacket 5 may comprise a plurality of support legs 55b.

A plurality of support legs 55b may be formed on the bottom jacket 55 to be spaced apart from each other in the horizontal direction.

The top coolant jacket 6 may be vertically symmetrical with the bottom coolant jacket 5 with the first control board 7 interposed therebetween. The first control board 7 is disposed between the top coolant jacket 6 and the bottom coolant jacket 5.

The top coolant jacket 6 may be formed with a third passage 61 communicating with the second passage 52 and a fourth passage 62 spaced apart from the third passage 61.

The top coolant jacket 6 may be formed with an upper coolant passage 63 and a plurality of upper cooling fins 64 through which coolant passes between the third passage 61 and the fourth passage 62.

The third passage 61 may be formed close to the other end of the top coolant jacket 6 in the longitudinal direction X. The third passage 61 may be open in the vertical direction Z of the top coolant jacket 6.

The fourth passage 62 may be formed at one end of the top coolant jacket 6 in the longitudinal direction X. The fourth passage 62 may be open in the longitudinal direction X of the top coolant jacket 6.

The upper coolant passage 63 may be formed to be long in the longitudinal direction X of the top coolant jacket 6.

The plurality of upper cooling fins 64 may be located in the upper coolant passage 63 and may be formed to be long in the longitudinal direction X of the top coolant jacket 6. The length of the plurality of upper cooling fins 64 may be shorter than the length of the upper coolant passage 63.

The plurality of upper cooling fins 64 may be disposed in the upper coolant passage 63. The plurality of upper cooling fins 64 may be spaced apart from each other in the width direction Y of the top coolant jacket 6. A unit passage through which coolant is distributed may be formed between a pair of adjacent upper cooling fins 64.

The top coolant jacket 6 may be composed of a combination of multiple members. The top coolant jacket 6 may comprise a top jacket 65 and an inner top cover 66.

The third passage 61, the fourth passage 62, the upper coolant passage 63, and the plurality of upper cooling fins 64 may be formed in the top jacket 65.

The top jacket 65 may be formed with an upper opening 65a formed below the lower side of the upper coolant passage 63 to expose the upper coolant passage 63 and the plurality of upper cooling fins 64.

The inner top cover 66 may be placed on the lower surface of the top jacket 65. The inner top cover 66 may be disposed in the upper opening 65a. The inner top cover 66 may cover the upper coolant passage 63 and the plurality of upper cooling fins 64.

The bottom coolant jacket 5 and the top coolant jacket 6 may be fastened with a fastening member such as a screw.

A space S1 in which the first control board 7 can be accommodated may be formed between the bottom coolant jacket 5 and the top coolant jacket 6.

The first control board 7 may be disposed between the bottom coolant jacket 5 and the top coolant jacket 6. The first control board 7 may be accommodated in the space S1 formed between the bottom coolant jacket 5 and the top coolant jacket 6.

The first control board 7 may comprise a substrate 71 and a semiconductor chip 72 installed on the substrate 71. An example of the semiconductor chip 72 may be to execute level 1 or level 2 among the autonomous driving levels and may be an autonomous driving chip such as an MCU.

The first control board 7 may be in thermal contact with each of the bottom coolant jacket 5 and the top coolant jacket 6.

The lower surface of the substrate 71 or the semiconductor chip 72 protruding from the lower surface of the substrate 71 may be in thermal contact with the bottom coolant jacket 5, particularly the inner bottom cover 56.

The upper surface of the substrate 71 or the semiconductor chip 72 protruding from the upper surface of the substrate 71 may be in thermal contact with the top coolant jacket 6, particularly the inner top cover 66.

A groove 73 may be formed in the first control board 7 to avoid at least one of the second passage 52 and the third passage 61.

The first control unit 1 may further comprise an inner gasket 8 that seals between the second passage 52 and the third passage 61.

The lower portion of the inner gasket 8 may be inserted into the second passage 52, the upper portion may be inserted into the third passage 61, and the protrusion formed at the center of the inner gasket 8 is placed between the bottom coolant jacket 5 and the top coolant jacket 6.

The coolant may pass through the lower coolant passage 53, the coolant may cool the lower surface of the first control board 7, and the coolant sequentially passes through the second passage 52, the inside of the inner gasket 8, and the third passage 61. The Coolant may pass through the upper coolant passage 63, and the coolant may cool the upper surface of the first control board 7 while passing through the upper coolant passage 63.

Contrarily, the coolant may pass through the upper coolant passage 63, and the coolant may cool the upper surface of the first control board 7, and the coolant sequentially passes through the third passage 61, the inside of the inner gasket 8, and the second passage 52. The Coolant may pass through the lower coolant passage 53, and the coolant may cool the lower surface of the first control board 7 while passing through the lower coolant passage 53.

The first control unit 1 may comprise a first nipple 9 disposed in the first passage 51; and a second nipple 10 disposed in the fourth passage 62.

A portion of the first nipple 9 may be inserted into the first passage 51.

A portion of the second nipple 10 may be inserted into the fourth passage 62.

The second control unit 2 may be parallel to the first control unit 1. The second control unit 2 may have a length in the front and rear direction X, a width in the left and right direction Y, and a thickness in the up and down direction Z.

The second control unit 2 may be disposed below the lower surface of the bottom coolant jacket 3.

The second control unit 2 may comprise a first lower case 21, a second lower case 22, and a second control board 23.

A coolant passage is not formed in the second control unit 2, and the second control unit 2 may be disposed below the lower surface of the bottom coolant jacket 5, and the second control unit 2 may be cooled by the coolant passing through the lower coolant passage 53.

The first lower case 21 may be disposed below the lower surface of the bottom coolant jacket 5.

The second lower case 22 may be disposed below the first lower case 21. The second lower case 22 may be fastened to the first lower case 21 using a fastening member such as a screw.

The second control board 23 may be accommodated between the first lower case 21 and the second lower case 22.

A space S2 in which the second control board 23 can be accommodated may be formed between the first lower case 21 and the second lower case 22.

The second control board 23 may comprise a substrate 24 and a semiconductor chip 25 installed on the substrate 24. An example of the semiconductor chip 25 may be capable of executing level 2+ among autonomous driving levels and may be an autonomous driving chip such as an MCU. Another example of the semiconductor chip 25 may be capable of executing infotainment and may be an infotainment chip such as an MCU.

The second control board 23 may be in thermally contact with the bottom coolant jacket 5.

The upper surface of the substrate 24 or the semiconductor chip 25 protruding from the upper surface of the substrate 24 may be thermally contacted with the coolant passing through the lower coolant passage 53 through the first lower case 21 and the bottom jacket 55.

The electronic control unit may further comprise a lower thermal pad 26 disposed between the bottom coolant jacket 5 and the upper surface of the second control unit 21. The lower thermal pad 24 may be disposed between the lower surface of the bottom coolant jacket 5 and the upper surface of the first lower case 21.

If the electronic control unit further comprises a lower thermal pad 26, the upper surface of the substrate 24 or the semiconductor chip 25 protruding on the upper surface of the substrate 24 may be thermally contacted with the coolant passing through the lower coolant passage 53 through the first lower case 21, the lower thermal pad 26 and the bottom jacket 55.

The third control unit 3 may be parallel to the first control unit 1. The third control unit 3 may have a length in the front and rear direction X, a width in the left and right direction Y, and a thickness in the up and down direction Z.

The third control unit 3 may be disposed above the upper surface of the top coolant jacket 6.

The size of the third control unit 3 may be smaller than the size of the first control unit 1.

The third control unit 3 comprises a first upper case 31 and a second upper case 32; and a first upper control board 33.

A coolant passage is not formed in the third control unit 3, and the third control unit 3 can be disposed above the upper surface of the top coolant jacket 6, and the third control unit 3 may be cooled by the coolant passing through the upper coolant passage 63.

The first upper case 31 may be disposed above the upper surface of the top coolant jacket 6.

The second upper case 32 may be displaced above the first upper case 31.

The second upper case 32 may be fastened to the first upper case 31 using a fastening member such as a screw.

The first upper control board 33 may be accommodated between the first upper case 31 and the second upper case 32.

A space S3 in which the first upper control board 33 can be accommodated may be formed between the first upper case 31 and the second upper case 32.

The first upper control board 33 may comprise a substrate 34 and a semiconductor chip 35 installed on the substrate 34, and an example of the semiconductor chip 35 is capable of executing level 3 of the autonomous driving levels and may be an autonomous driving chip such as an MCU.

The first upper control board 33 may be in thermally contact with the top coolant jacket 6.

The lower surface of the substrate 34 or the semiconductor chip 35 protruding from the lower surface of the substrate 34 may be thermally contacted with the coolant passing through the upper coolant passage 63 through the first upper case 31 and the top jacket 65.

The electronic control unit may comprise a first upper thermal pad 36 disposed between the upper surface of the top coolant jacket 6 and the lower surface of the third control unit 3. The first upper thermal pad 36 may be disposed between the upper surface of the top coolant jacket 6 and the first upper case 31.

If the electronic control unit further comprises a first upper thermal pad 36, the lower surface of the substrate 34 or the semiconductor chip 35 protruding from the lower surface of the substrate 34 may be in thermally contact with the coolant passing through the upper coolant passage 63 through the first upper case 31, the upper thermal pad 36 and the top jacket 65.

The fourth control unit 4 may be parallel to the first control unit 1. The third control unit 3 may have a length in the front and rear direction X, a width in the left and right direction Y, and a thickness in the up and down direction Z.

The size of the fourth control unit 4 may be smaller than the size of the first control unit 1.

The fourth control unit 4 may be disposed above the upper surface of the top coolant jacket 6.

The fourth control unit 4 comprises a third upper case 41 and a fourth upper case 42; and a second upper control board 43.

A coolant passage is not formed in the fourth control unit 4, and the fourth control unit 4 may be disposed above the upper surface of the top coolant jacket 6, and may be cooled by the coolant passing through the upper coolant passage 63.

The third upper case 41 may be disposed above the upper surface of the top coolant jacket 6.

The fourth upper case 42 may be placed above the third upper case 41.

The fourth upper case 42 may be fastened to the third upper case 41 using a fastening member such as a screw.

The second upper control board 43 may be accommodated between the third upper case 41 and the fourth upper case 42.

A space S4 in which the fourth control board 43 can be accommodated may be formed between the third upper case 41 and the fourth upper case 42.

The second upper control board 43 may comprise a substrate 44 and a semiconductor chip 45 installed on the substrate 44, and an example of the semiconductor chip 45 is capable of executing level 4 of the autonomous driving levels and may be an autonomous driving chip such as an MCU.

The second upper control board 43 may be in thermally contact with the top coolant jacket 6.

The lower surface of the substrate 44 or the semiconductor chip 45 protruding from the lower surface of the substrate 44 may be thermally contacted with the coolant passing through the upper coolant passage 63 through the third upper case 41 and the top jacket 65.

The electronic control unit may further comprise a second upper thermal pad 46 disposed between the upper surface of the top coolant jacket 6 and the lower surface of the fourth control unit 4. The second upper thermal pad 46 may be disposed between the upper surface of the top coolant jacket 6 and the third upper case 41.

If the electronic control unit further comprises a second upper thermal pad 46, the lower surface of the substrate 44 or the semiconductor chip 45 protruding from the lower surface of the substrate 44 may be in thermally contact with the coolant passing through the upper coolant passage 63 through the third upper case 41, the second upper thermal pad 46 and the top jacket 65.

The third control unit 3 and the fourth control unit 4 may be disposed in line in the longitudinal direction X of the first control unit 1. The third control unit 3 may be disposed closer to the fourth passage 62 of the third passage 61 and fourth passage 62. The fourth control unit 4 may be disposed closer to the third passage 61 of the third passage 61 and the fourth passage 62.

An example of an electronic control unit comprises all of the first control unit 1, the second control unit 2, the third control unit 3, and the fourth control unit 4, and the semiconductor chips of the first control board 7, the second control board 23, the first upper control board 33, and the second upper control board 43 may be driven together for level 4 autonomous driving.

In the case of an example of an electronic control unit, the first control board 7, the first upper control board 33, and the second upper control board 43 may be a higher heat source than the second control board 23, and as shown in FIG. 1, it is preferable that the coolant may be supplied to the electronic control unit through the second nipple 10.

Figure 6:
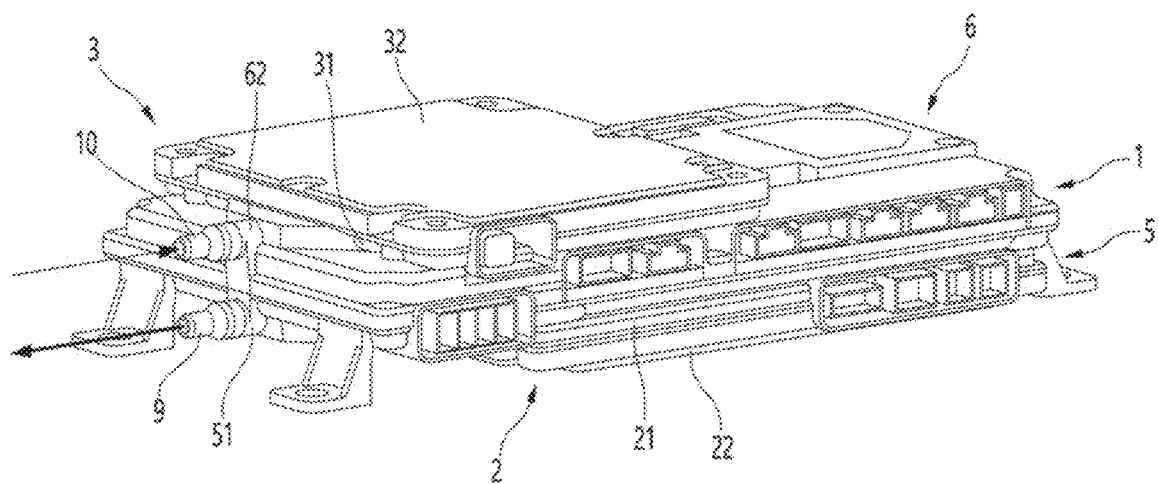
FIG. 6 is a perspective view of another example of an electronic control unit according to this embodiment.

FIG. 6 is a perspective view of another example of an electronic control unit according to this embodiment.

Another example of an electronic control unit, as shown in FIG. 6, does not comprise a fourth control unit 4, but comprises the first control unit 1, the second control unit 2, and the third control unit 3. Each semiconductor chips of the first control board 7, the second control board 23, and the first upper control board 33, respectively, may be driven together for level 3 autonomous driving.

In the case of another example of the electronic control unit, the first control board 7 and the first upper control board 33 may be a higher heat source than the second control board 23, and as shown in FIG. 6, it is preferable that the coolant may be supplied to the electronic control unit through the nipple 10.

Figure 7:
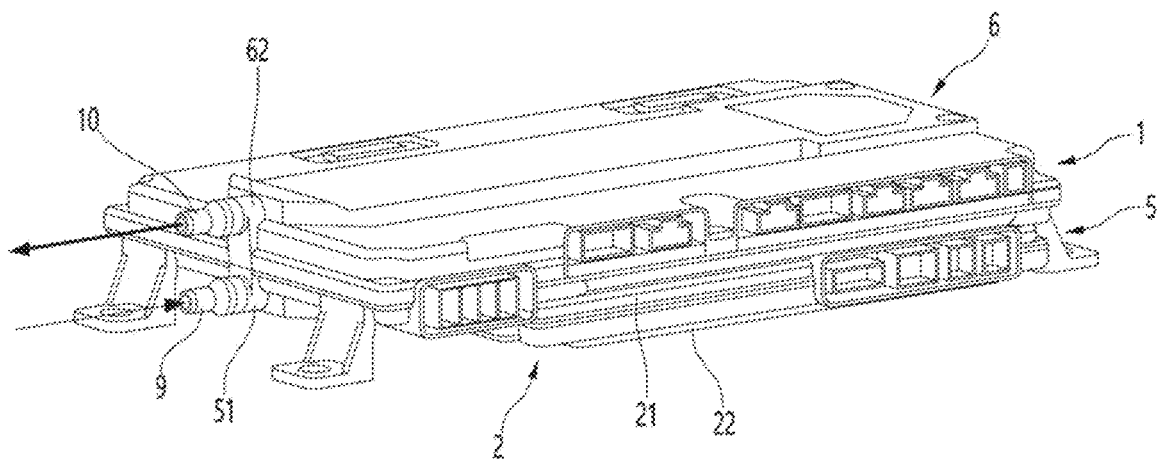
FIG. 7 is a perspective view of the other example of an electronic control unit according to this embodiment.

FIG. 7 is a perspective view of the other example of an electronic control unit according to this embodiment.

The other example of the electronic control unit is as shown in FIG. 7, the electronic control unit does not comprise the third control unit 3 and the fourth control unit 4, but comprises the first control unit 1 and the second control unit 2. Each semiconductor chip of the first control board 7 and the second control board 23 can be driven for level 1, level 2, or level 2+ autonomous driving.

In the case of the other example of the electronic control unit, as shown in FIG. 7, it is preferable that the coolant may be supplied through the first nipple 9 so that each of the first control board 7 and the second control board 23 can be cooled quickly.

Figure 8:
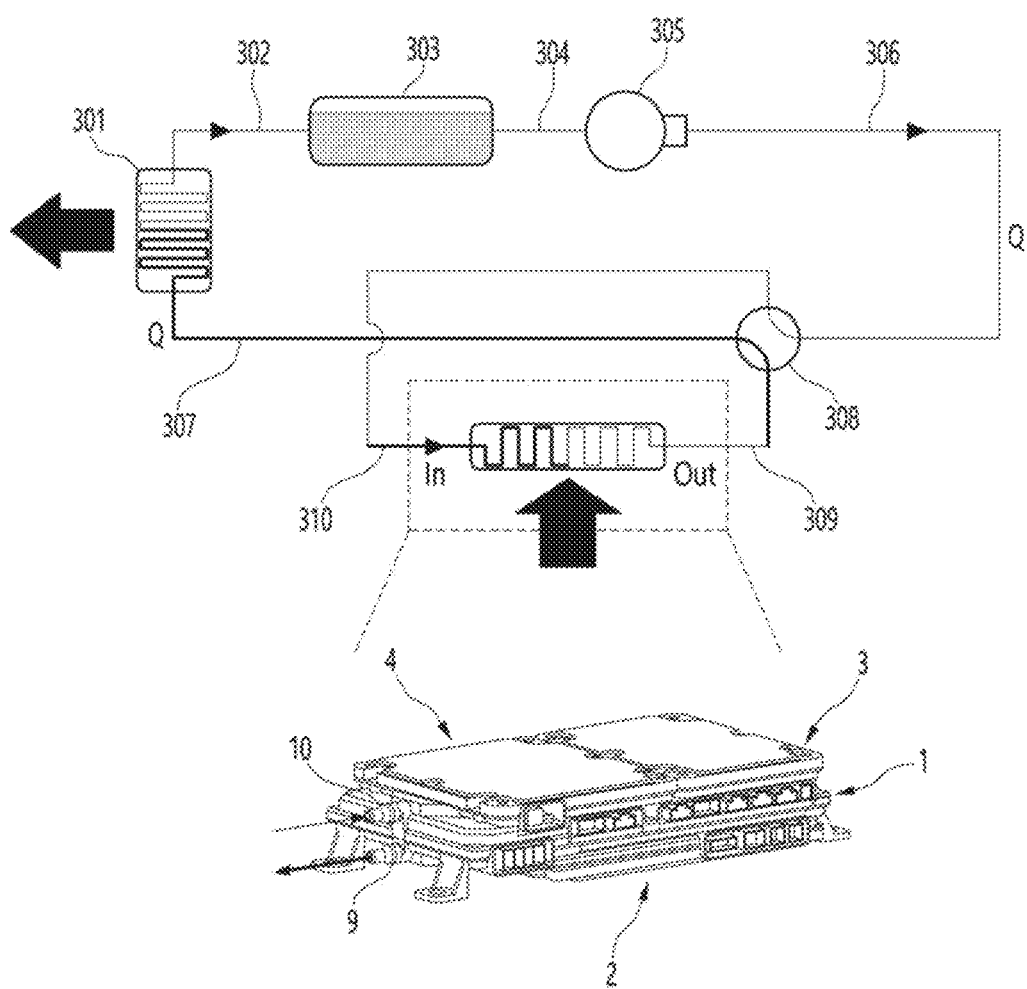
FIG. 8 is a view an example in which the electronic control unit according to this embodiment is cooled by a water-cooled cooling device.
Figure 9:
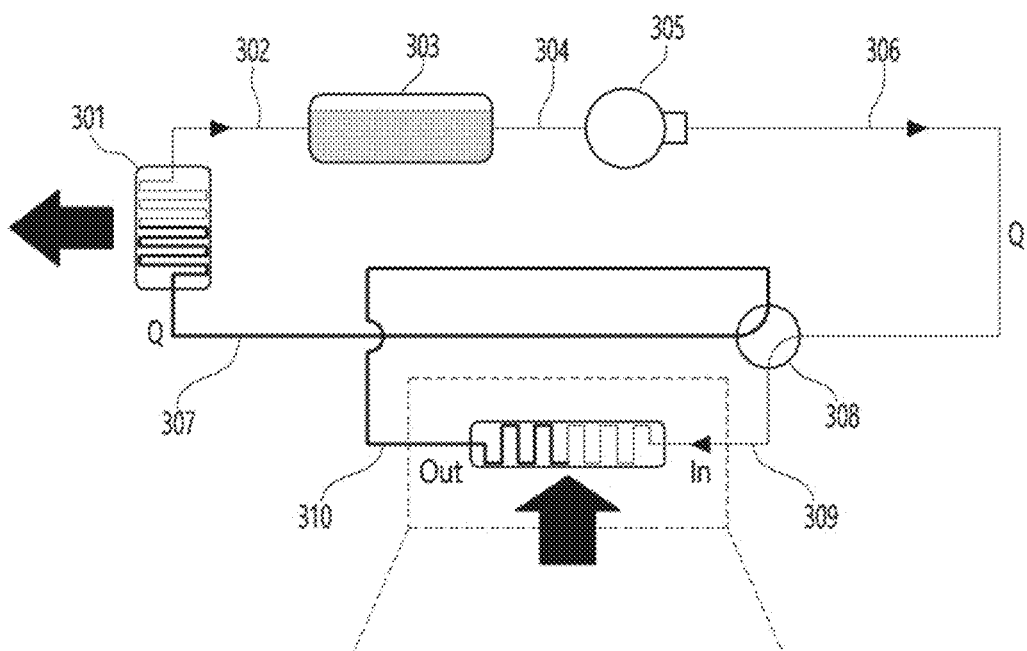
FIG. 9 is a view the other example in which the electronic control unit according to this embodiment is cooled by a water-cooled cooling device.
Figure 9:
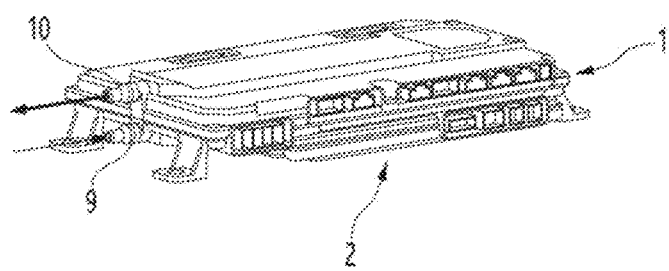

FIG. 8 is a view an example in which the electronic control unit according to this embodiment is cooled by a water-cooled cooling device; and FIG. 9 is a view the other example in which the electronic control unit according to this embodiment is cooled by a water-cooled cooling device.

The water-cooled cooling device 100 may be installed in the vehicle and may circulate and supply coolant to the electronic control unit installed in the vehicle.

The water-cooled cooling device 300 may be connected to the electronic control unit with a water pipe.

The water-cooled cooling device 300 comprises a heat exchanger 301, a coolant tank 303 connected to the heat exchanger 301 via a heat exchanger outlet pipe 302, a pump 305 connected to the coolant tank 303 via the pump inlet pipe 304 and a pump outlet pipe 306 connecting the pump 305 and the electronic control unit, and the electronic control unit and the heat exchanger 301 may be connected to a heat exchanger inlet pipe 307.

The heat exchanger 301 may dissipate heat from the coolant into the atmosphere in an air-cooled manner.

The water-cooled cooling device 300 may comprise a cooling water valve 308.

As shown in FIG. 8, the coolant valve 308 may supply coolant to the second nipple 10.

As shown in FIG. 9, the coolant valve 308 may supply coolant to the first nipple 9.

An example of the coolant valve 308 may be a four-way valve.

The pump outlet pipe 306 may be connected to the cooling water valve 308.

The heat exchanger inlet pipe 307 may be connected to the cooling water valve 308.

The coolant valve 308 and the first nipple 9 may be connected to a first nipple connection pipe 309.

The coolant valve 308 and the second nipple 10 may be connected to the second nipple connection pipe 310.

As shown in FIG. 1, in case of the electronic control unit comprises the first control unit 1, the second control unit 2, the third control unit 3 and the fourth control unit 4, or the electronic control unit comprises the first control unit 1, the second control unit 2, and the third control unit 3, as shown in FIG. 8, the coolant valve 308 may be switched to supply the coolant to the second nipple 10

As shown in FIG. 7, in case of the electronic control unit comprises a first control unit (1), and a second control unit (2), and the electronic control unit does not comprise a third control unit (3) and a fourth control unit (4), as shown in FIG. 9, the coolant valve 808 may be switched to supply the coolant to the first nipple.

The coolant may circulate through the heat exchanger 301 and the electronic control unit and dissipate heat in the electronic control unit.

Figure 10:
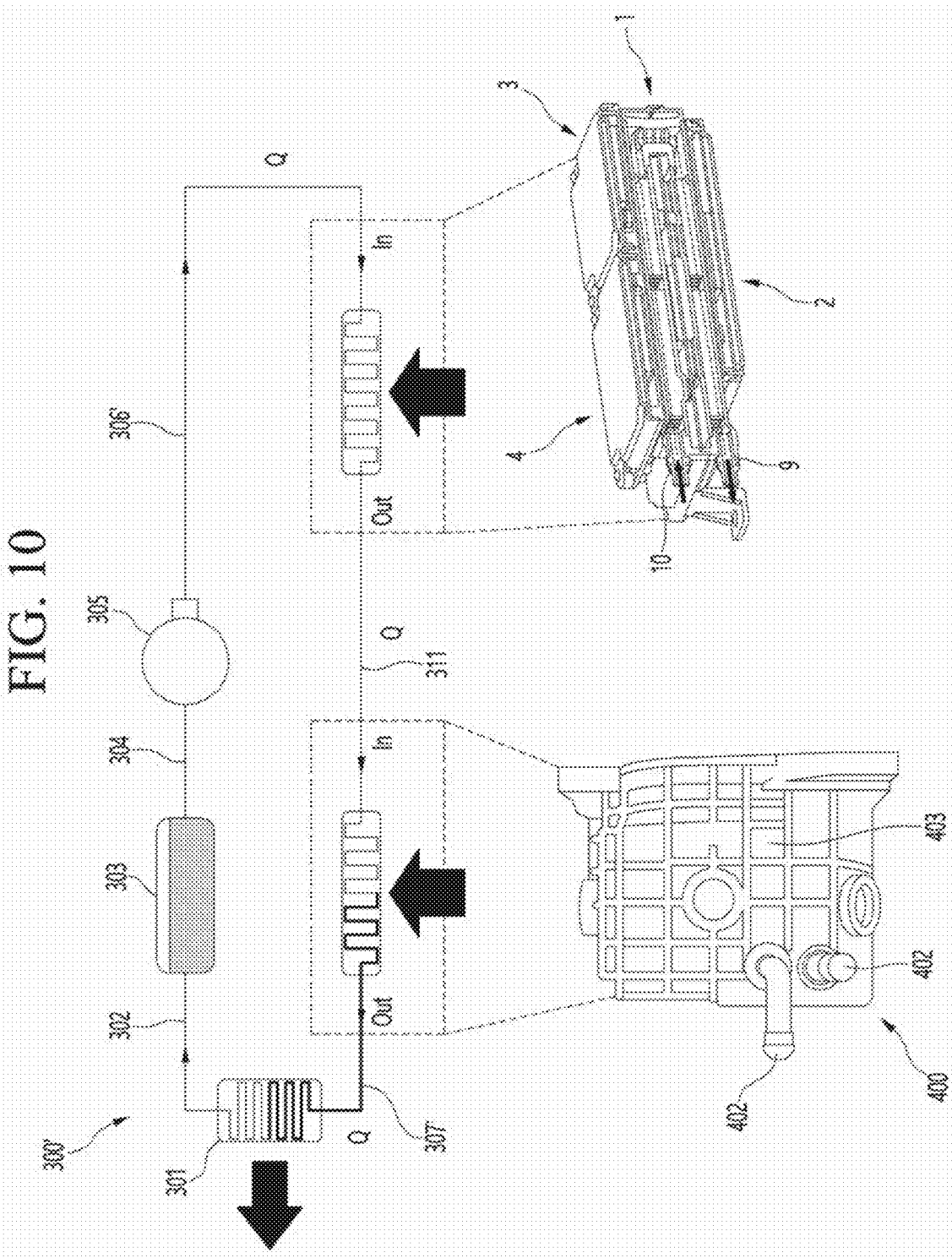
FIG. 10 is a view showing when the electronic control unit and motor according to this embodiment are cooled by a water-cooled cooling device.

FIG. 10 is a view showing when the electronic control unit and motor according to this embodiment are cooled by a water-cooled cooling device.

The water-cooled cooling device 300' is connected to the electronic control unit and the motor 400, and may circulate cold cooling water through the electronic control unit and the motor 400.

An example of the motor 400 may be a drive motor provided in an electric vehicle to provide driving force to the wheels.

The motor 400 may comprise a motor housing 403 in which a coolant inlet port 401 and a coolant outlet port 402 are formed.

The water-cooled cooling device 300' may be connected to the electronic control unit and motor 400 through a water pipe.

The water-cooled cooling device 300' may comprise a heat exchanger 301, a coolant tank 303 connected to the heat exchanger 301 via a heat exchanger outlet pipe 302, a pump 305 connected to the coolant tank 303 via a pump inlet pipe 304, a pump outlet pipe 306' connecting the pump 305 and the electronic control unit, a connection passage 311 connecting the electronic control unit and the motor 400, and a heat exchanger inlet pipe 307' connected to the motor 400 and the heat exchanger 301.

The heat exchanger 301, the heat exchanger outlet pipe 302, the cooling water tank 303, the pump inlet pipe 304, and the pump 305 are the same as the water-cooled cooling device 300 shown in FIG. 9, their descriptions will be omitted to avoid redundant explanation.

The pump outlet pipe 306' may be connected to either the first nipple 9 or the second nipple 10.

The heat exchanger inlet pipe 307' may be connected to the coolant outlet port 402 of the motor 400.

One end of the connection passage 311 may be connected to the other one of the first nipple 9 or the second nipple 10.

The other end of the connection passage 311 may be connected to the coolant inlet port 401 of the motor 400.

The coolant may circulate through the heat exchanger 301, the electronic control unit, and the motor 400, and may sequentially dissipate heat through the electronic control unit and the motor 400.

Figure 11:
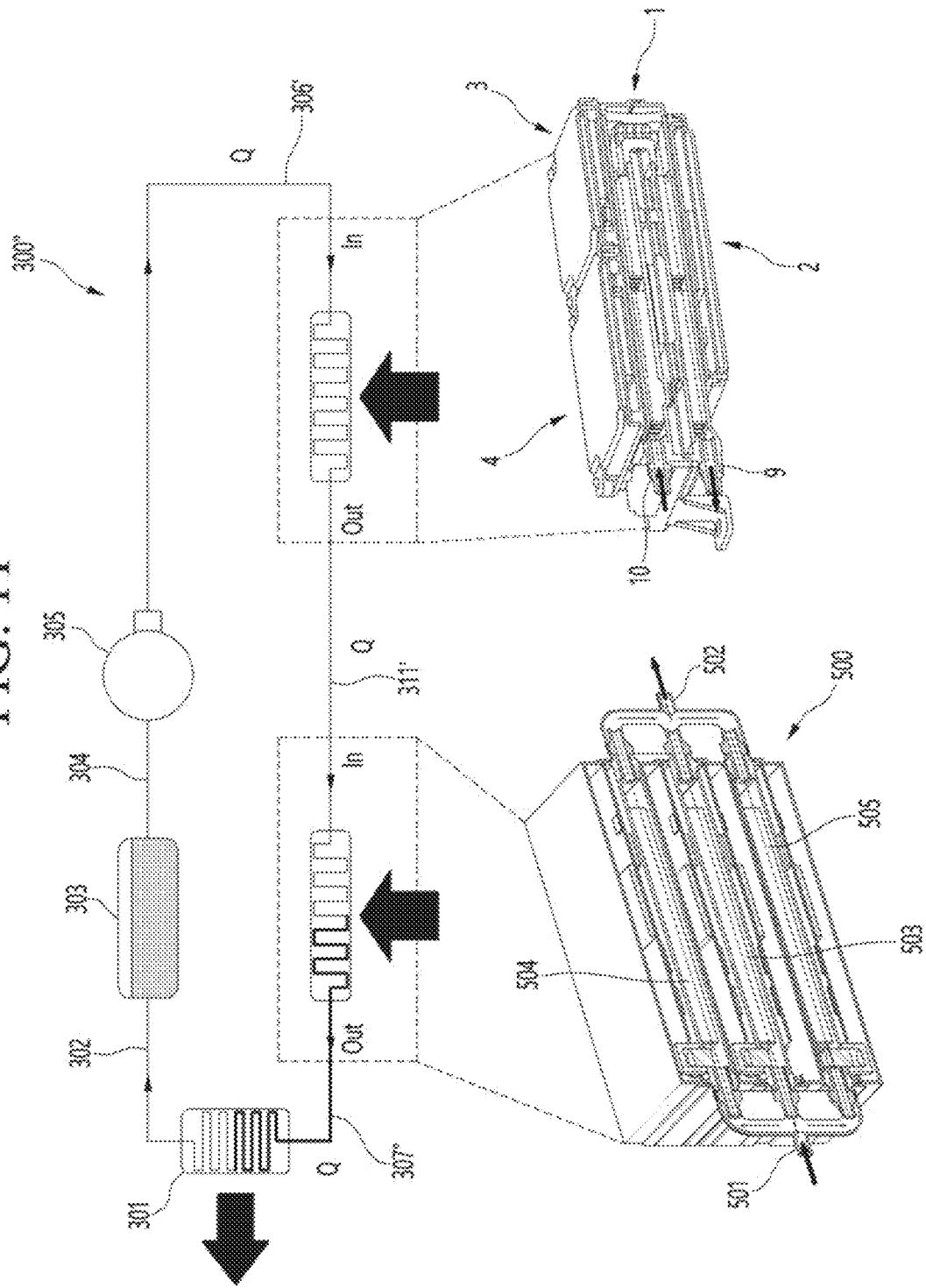
FIG. 11 is a view when the electronic control unit and the additional electronic control unit according to this embodiment are cooled by a water-cooled cooling device.

FIG. 11 is a view when the electronic control unit and the additional electronic control unit according to this embodiment are cooled by a water-cooled cooling device.

The water-cooled cooling device 300" may be connected to the electronic control unit and an additional electronic control unit 500, and may circulate cold cooling water to the electronic control unit and the additional electronic control unit 500.

The additional electronic control unit 500 may comprise an additional coolant jacket in which a coolant inlet 501 and a coolant outlet 502 are formed.

An example of the additional electronic control unit 500 may be an electronic control unit provided separately from the electronic control unit, and may comprise a plurality of additional coolant jackets 503, 504, and 505.

The plurality of additional coolant jackets 503, 504, and 505 may be configured to have coolant flow paths connected in parallel.

The water-cooled cooling device 300" may be connected to the electronic control unit and the additional electronic control unit 500 through a water pipe.

The water-cooled cooling device 300" may comprise a heat exchanger 301, a cooling water tank 303 connected to the heat exchanger 301 via the heat exchanger outlet pipe 302, a pump 305 connected to the cooling water tank 303 via the pump inlet pipe 304, a pump outlet pipe 306' connecting the pump 305 and the electronic control unit, a connection passage 311' connecting the electronic control unit and the additional electronic control unit 500, and a heat exchanger inlet pipe 307" connecting the additional electronic control unit 500 and the heat exchanger 301.

The heat exchanger 301, the heat exchanger outlet pipe 302, the cooling water tank 303, the pump inlet pipe 304, the pump 305, and the pump outlet pipe 306' are the same as the water-cooled cooling device 300' shown in FIG. 10, their description will be omitted to avoid redundant explanation.

The pump outlet pipe (306') may be connected to either the first nipple (9) or the second nipple (10).

One end of the connection passage 311' may be connected to the other one of the first nipple 9 and the second nipple 10.

The other end of the connection passage 311' may be connected to the coolant inlet 501 of the additional electronic control unit 500.

The heat exchanger inlet pipe 307" may be connected to the coolant outlet 502 of the additional electronic control unit 500.

The coolant may circulate through the heat exchanger 301, the electronic control unit, and the additional electronic control unit 500, and may sequentially dissipate heat through the electronic control unit and the additional electronic control unit 500.

The coolant may flow through the passage at a specific flow rate Q by the pump 305, and the coolant may flow into the electronic control unit, cool the heat source of the electronic control unit, and then flow out of the electronic control unit.

The coolant flowing out of the electronic control unit may flow to the additional electronic control unit 500 to cool the heat source of the additional electronic control unit 500 and then may pass through the heat exchanger 301 to drop to the initial temperature, and the coolant whose temperature has been initialized flows into the coolant tank 303.

The above process may be repeated for the coolant stored in the coolant tank 303.

According to this embodiment, the coolant sequentially passing through the lower coolant passage and the upper coolant passage can cool the lower and upper surfaces of the first control board, and both sides of the first control board can be quickly cooled with a simple structure.

In addition, the coolant passing through the lower coolant passage can cool the first control board and the second control board together, and the lower coolant passage can also serve as the coolant passage of the first control board and the coolant passage of the second control board, the structure is simple and compactization is possible.

In addition, the coolant passing through the upper coolant passage can cool the first control board and the third control board together, and the upper coolant passage can also serve as the coolant passage of the first control board and the coolant passage of the third control board, the structure is simple and compactization is possible.

In addition, the coolant passing through the upper coolant passage can cool the first control board, the third control board, and the fourth control board together, and the upper coolant passage is the coolant passage of the first control board and the coolant passage of the third control board and a coolant passage for the fourth control board, the structure is simple and compactization is possible.

In addition, the electronic control unit may comprise a first control unit and a second control unit, or may comprise a first control unit, a second control unit and a third control unit, or may comprise a first control unit, a second control unit and a third control unit, unit and a fourth control unit, so the electronic control unit can be expanded depending on the vehicle.

In addition, the coolant valve can allow the coolant to pass through the lower coolant passage first or the upper coolant passage first, allowing the coolant to cool the control board of the high heat source more quickly.

The above description is merely an example of the technical idea of the present invention, and various modifications and variations can be made to those skilled in the art without departing from the essential characteristics of the present invention.

Therefore, the embodiments disclosed in the present invention are not intended to limit the technical idea of the present invention, but to explain, and the scope of the technical idea of the present invention is not limited by these embodiments.

The protection scope of the present invention should be construed according to the claims below, and all technical ideas within the equivalent range should be construed as being comprised in the scope of the present invention.

What is claimed is:

1. An electronic control unit comprising:
   a first control unit, wherein the first control unit comprises:
     a bottom coolant jacket in which a first passage and a second passage spaced apart from the first passage are formed; and
     a top coolant jacket in which a third passage communicate with the second passage and a fourth passage spaced apart from the third passage are formed;
   a second control unit disposed below a lower surface of the bottom coolant jacket; and
   a third control unit disposed above an upper surface of the top coolant jacket,
   wherein a lower coolant passage through which coolant is configured to pass is formed between the first passage and the second passage and a plurality of lower cooling fins are formed in the lower coolant passage,
   wherein an upper coolant passage through which the coolant is configured to pass is formed between the third passage and the fourth passage and a plurality of upper cooling fins are formed in the upper coolant passage, and
   wherein a first control board is disposed between the bottom coolant jacket and the top coolant jacket.

2. The electronic control unit according to claim 1, wherein the bottom coolant jacket comprises:
   a bottom jacket formed with the first passage, the second passage, the lower coolant passage, and the plurality of lower cooling fins; and
   an inner bottom cover disposed on an upper surface of the bottom jacket and covering the lower coolant passage and the plurality of lower cooling fins.

3. The electronic control unit according to claim 1, wherein the top coolant jacket comprises:
   a top jacket formed with the third passage, the fourth passage, the upper coolant passage, and the plurality of upper cooling fins; and
   an inner top cover disposed on a lower surface of the top jacket and covering the upper coolant passage and the plurality of upper cooling fins.

4. The electronic control unit according to claim 1, wherein the first control unit further comprises an inner gasket sealing between the second passage and the third passage.

5. The electronic control unit according to claim 1, wherein the second control unit comprises:
   a first lower case disposed below the lower surface of the bottom coolant jacket;
   a second lower case disposed below the first lower case; and
   a second control board accommodated between the first lower case and the second lower case.

6. The electronic control unit according to claim 5, further comprising a lower thermal pad disposed between the lower surface of the bottom coolant jacket and an upper surface of the first lower case.

7. The electronic control unit according to claim 1, wherein the third control unit comprises:
   a first upper case disposed above the upper surface of the top coolant jacket;
   a second upper case disposed above the first upper case; and
   a first upper control board accommodated between the first upper case and the second upper case.

8. The electronic control unit according to claim 7, further comprising an upper thermal pad disposed between the upper surface of the top coolant jacket and a lower surface of the first upper case.

9. The electronic control unit according to claim 7, further comprising a fourth control unit disposed above the upper surface of the top coolant jacket.

10. The electronic control unit according to claim 9, wherein the fourth control unit comprises:
    a third upper case disposed above the upper surface of the top coolant jacket;
    a fourth upper case disposed above the third upper case; and
    a second upper control board accommodated between the third upper case and the fourth upper case.

11. The electronic control unit according to claim 10, further comprising an upper thermal pad disposed between the upper surface of the top coolant jacket and a lower surface of the third upper case.

12. The electronic control unit according to claim 9, wherein the fourth control unit is arranged in line with the third control unit in a longitudinal direction of the first control unit.

13. The electronic control unit according to claim 12, wherein the third control unit is closer to the fourth passage of the third passage and the fourth passage, and the fourth control unit is closer to the third passage of the third passage and the fourth passage.

14. A vehicle comprising:
    an electronic control unit comprising a first control unit; and
    a water-cooled cooling device configured to flow coolant to the first control unit, wherein the first control unit comprises:
- a bottom coolant jacket in which a first passage and a second passage spaced apart from the first passage are formed;
- a top coolant jacket in which a third passage that communicates with the second passage and a fourth passage spaced apart from the third passage are formed;
- a first nipple disposed in the first passage; and
- a second nipple disposed in the fourth passage, wherein a lower coolant passage through which coolant is configured to pass is formed between the first passage and the second passage and a plurality of lower cooling fins are formed in the lower coolant passage, wherein an upper coolant passage through which the coolant is configured to pass is formed between the third passage and the fourth passage and a plurality of upper cooling fins are formed in the upper coolant passage, wherein a first control board is disposed between the bottom coolant jacket and the top coolant jacket, and wherein the water-cooled cooling device comprises a coolant valve configured to supply the coolant to the first nipple or to the second nipple.

15. The vehicle according to claim 14, further comprising a second control unit disposed below a lower surface of the bottom coolant jacket, wherein the coolant valve is configured to supply the coolant to the first nipple.

16. The vehicle according to claim 14, further comprising:
- a second control unit disposed below a lower surface of the bottom coolant jacket; and
- a third control unit disposed above an upper surface of the top coolant jacket, wherein the coolant valve is configured to supply the coolant to the second nipple.

17. The vehicle according to claim 16, further comprising a fourth control unit disposed above the upper surface of the top coolant jacket.

18. The vehicle according to claim 17, wherein the third control unit is closer to the fourth passage of the third passage and the fourth passage, and the fourth control unit is closer to the third passage of the third passage and the fourth passage.

* * * * *